United States Patent
Sanroma et al.

(10) Patent No.: US 8,139,376 B2
(45) Date of Patent: Mar. 20, 2012

(54) HOUSING FOR ELECTRONIC BALLAST

(75) Inventors: John P. Sanroma, Bedford, MA (US); Russell R. Holden, Newburyport, MA (US); Andrew O. Johnson, Danvers, MA (US); Guy P. Bouchard, Beverly, MA (US)

(73) Assignee: OSRAM SYLVANIA Inc., Danvers, MA (US)

( * ) Notice: Subject to any disclaimer, the term of this patent is extended or adjusted under 35 U.S.C. 154(b) by 1007 days.

(21) Appl. No.: 12/279,593

(22) PCT Filed: Oct. 4, 2004

(86) PCT No.: PCT/US2004/032528
§ 371 (c)(1),
(2), (4) Date: Sep. 16, 2009

(87) PCT Pub. No.: WO2005/034589
PCT Pub. Date: Apr. 14, 2005

(65) Prior Publication Data
US 2010/0259901 A1 Oct. 14, 2010

Related U.S. Application Data

(60) Provisional application No. 60/508,520, filed on Oct. 3, 2003.

(51) Int. Cl.
*H05K 9/00* (2006.01)
*H05K 7/20* (2006.01)
*H05K 5/06* (2006.01)

(52) U.S. Cl. ........ 361/818; 361/753; 361/816; 174/350; 174/377

(58) Field of Classification Search .................. 361/720, 361/753, 816, 818; 174/350, 377
See application file for complete search history.

(56) References Cited

U.S. PATENT DOCUMENTS

| | | | | |
|---|---|---|---|---|
| 2,166,003 | A * | 7/1939 | Green | 220/325 |
| 4,414,851 | A * | 11/1983 | Maglic | 73/706 |
| 4,851,609 | A * | 7/1989 | Reddy | 174/371 |
| 4,879,629 | A * | 11/1989 | Tustaniwskyj et al. | 361/699 |
| 4,910,434 | A | 3/1990 | Doumani et al. | |
| 5,045,971 | A | 9/1991 | Ono et al. | |
| 5,179,506 | A * | 1/1993 | Corbett et al. | 361/807 |
| 5,418,685 | A | 5/1995 | Hussmann et al. | |
| 5,428,266 | A * | 6/1995 | Nilssen | 315/209 R |
| 5,566,055 | A * | 10/1996 | Salvi, Jr. | 361/816 |
| 5,719,746 | A * | 2/1998 | Ohbuchi et al. | 361/737 |
| 6,084,776 | A | 7/2000 | Cuntz et al. | |
| 6,090,728 | A | 7/2000 | Yenni, Jr. et al. | |
| 6,091,199 | A * | 7/2000 | Van Pelt et al. | 315/50 |
| 6,099,726 | A * | 8/2000 | Gembolis et al. | 210/243 |
| 6,138,347 | A * | 10/2000 | Persson et al. | 29/836 |
| 6,239,359 | B1 | 5/2001 | Lilienthal, II et al. | |
| 6,407,925 | B1 * | 6/2002 | Kobayashi et al. | 361/752 |
| 6,433,492 | B1 * | 8/2002 | Buonavita | 315/248 |
| 6,456,187 | B2 * | 9/2002 | Konda et al. | 337/194 |

(Continued)

FOREIGN PATENT DOCUMENTS

CN 2511095 Y 9/2002

(Continued)

*Primary Examiner* — Anatoly Vortman
(74) *Attorney, Agent, or Firm* — Edward S. Podszus

(57) ABSTRACT

An electronic housing assembly is formed with an environmental seal (20), EMI control (56) and a good thermal coupling (44, 46) made between enclosed hot electric components (48, 50) and an exterior heat sink (52, 54).

4 Claims, 4 Drawing Sheets

U.S. PATENT DOCUMENTS

| | | | |
|---|---|---|---|
| 6,552,911 B1 * | 4/2003 | Haupt et al. | 361/752 |
| 6,565,382 B1 | 5/2003 | Blodgett et al. | |
| 6,573,448 B2 * | 6/2003 | Mayer et al. | 174/481 |
| 6,707,256 B2 | 3/2004 | Brunker et al. | |
| 6,707,678 B2 * | 3/2004 | Kobayashi et al. | 361/752 |
| 6,717,051 B2 * | 4/2004 | Kobayashi et al. | 174/535 |
| 6,816,381 B2 * | 11/2004 | Takeuchi | 361/752 |
| 7,158,384 B2 * | 1/2007 | Huang | 361/752 |
| 7,218,516 B2 * | 5/2007 | Yu et al. | 361/695 |
| 7,230,823 B2 * | 6/2007 | Richardson et al. | 361/679.25 |
| 7,397,668 B2 * | 7/2008 | Sekine et al. | 361/732 |
| 7,420,811 B2 * | 9/2008 | Chan | 361/709 |
| 7,561,435 B2 * | 7/2009 | Kamoshida et al. | 361/752 |
| 7,563,992 B2 * | 7/2009 | Lawlyes et al. | 174/561 |
| 7,570,496 B2 * | 8/2009 | Chen et al. | 361/818 |
| 7,656,649 B2 * | 2/2010 | Loy et al. | 361/659 |
| 7,782,618 B2 * | 8/2010 | Hata et al. | 361/704 |
| 2003/0184981 A1 * | 10/2003 | Daniels et al. | 361/752 |
| 2003/0234619 A1 | 12/2003 | Brunker et al. | |
| 2004/0235317 A1 | 11/2004 | Schiefer | |
| 2006/0077640 A1 * | 4/2006 | Yoshikawa et al. | 361/752 |
| 2008/0169768 A1 * | 7/2008 | Yang | 315/276 |

FOREIGN PATENT DOCUMENTS

| | | |
|---|---|---|
| DE | 195 28 632 | 2/1997 |
| EP | 2 012 573 A2 | 1/2009 |
| JP | 63158898 A | 7/1988 |
| JP | 2276296 A | 11/1990 |
| JP | 2001144478 A | 5/2001 |
| RU | 1807837 A1 | 7/1995 |
| SU | 1035848 A1 | 8/1983 |
| SU | 173285 A | 9/1985 |
| TW | 511453 | 11/2002 |
| TW | 539390 | 6/2003 |
| WO | WO 99/57952 A1 | 11/1999 |
| WO | 03055289 | 7/2003 |

* cited by examiner

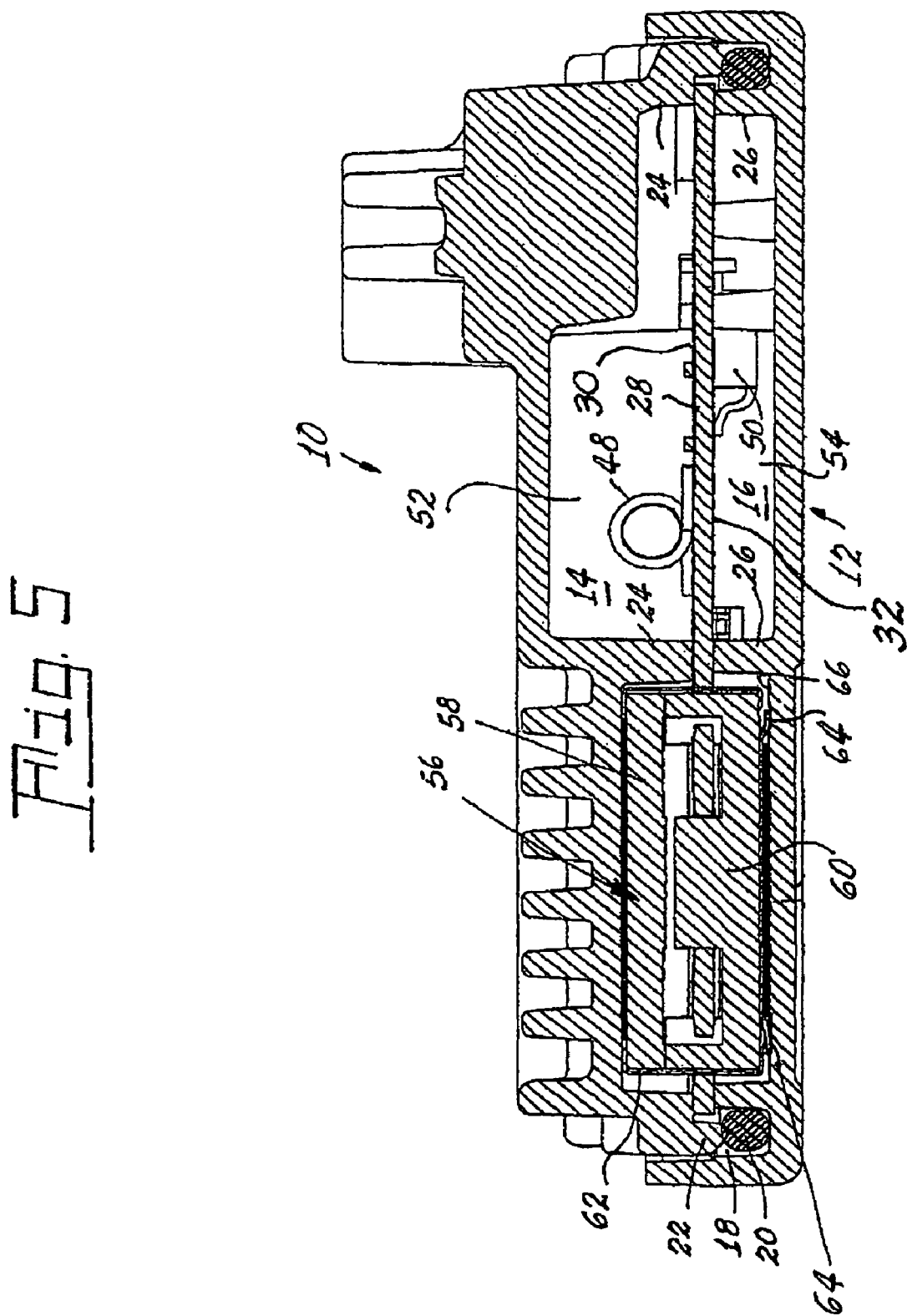

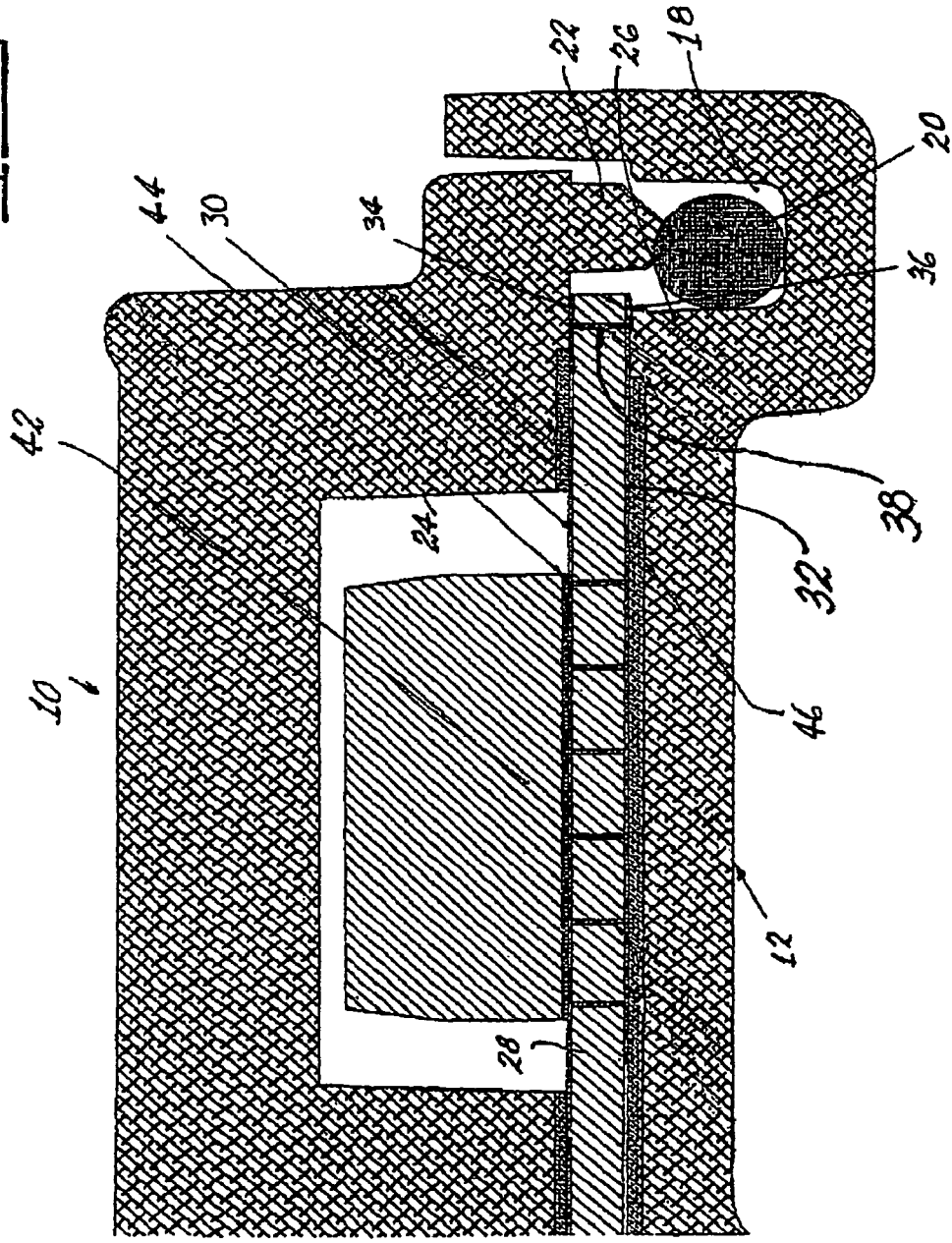

HOUSING FOR ELECTRONIC BALLAST

CROSS-REFERENCE TO RELATED APPLICATIONS

This application claims priority from Provisional Patent Application No. 60/508,520, filed Oct. 3, 2003.

TECHNICAL FIELD

This invention relates to electronic assemblies and more particularly to the simplification of such assemblies. Still more particularly, the invention relates to electronic ballasts for discharge lamps, such ballasts having improved heat dissipation, reduced component count, minimized mechanical stress on the electrical components and improved electromagnetic interference (EMI) suppression.

BACKGROUND ART

Electronic ballasts for discharge lamps are well known as efficient replacements for the older type of magnetic ballasts. As the trend toward miniaturization increases, additional problems arise in the control of heat dissipation, electrical isolation, mechanical stresses in locating printed circuit boards, and reducing EMI, which can affect other electric or electronic apparatus operating in the vicinity.

Accordingly, it would be an advance in the art if the problems with the prior devices could be reduced or eliminated.

DISCLOSURE OF INVENTION

It is, therefore, an object of the invention to obviate the disadvantages of the prior art.

It is another object of the invention to enhance the operation of electronic assemblies.

It is another object of the invention to enhance the operation of electronic ballasts for discharge lamps.

Yet another object of the invention is the reduction of mechanical stresses in such devices.

Still another object of the invention is the reduction of EMI emanating from such devices.

These objects are accomplished, in one aspect of the invention, by the provision of an electronic assembly comprising a housing having a first half and a second half, said first half and said second half being substantially quadrangular in configuration and including concave portions; a peripheral groove formed in said second half; an O-ring positioned in said groove; a depending peripheral flange formed on said first half for engaging said O-ring when said halves are mated; at least one first upstanding wall formed in said first half and at least one second upstanding wall formed in said second half, said walls being in opposition to one another and defining a space therebetween; a printed circuit board positioned between said wall in said first half and said wall in said second half, said printed circuit board having first and second surfaces; a peripheral electrical conductor formed on each of said first and second surfaces and in contact with said first upstanding wall and said second upstanding wall; at least one electrical conductor extending through said printed circuit board and in electrical contact with said peripheral electrical conductors formed on said first and second surfaces; and a plurality of retainers passing through said first half and into said second half, whereby pressure is applied to said printed circuit board for maintaining said printed circuit board in its desired location and electromagnetic interference is suppressed by virtue of the contact between said peripheral electrical conductors and said first and second halves.

BRIEF DESCRIPTION OF THE DRAWINGS

FIG. 5 is a sectional view taken along the line 5-5 of FIG. 1; and

FIG. 6 is a sectional view taken along the line 6-6 of FIG. 1.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Figure 2:
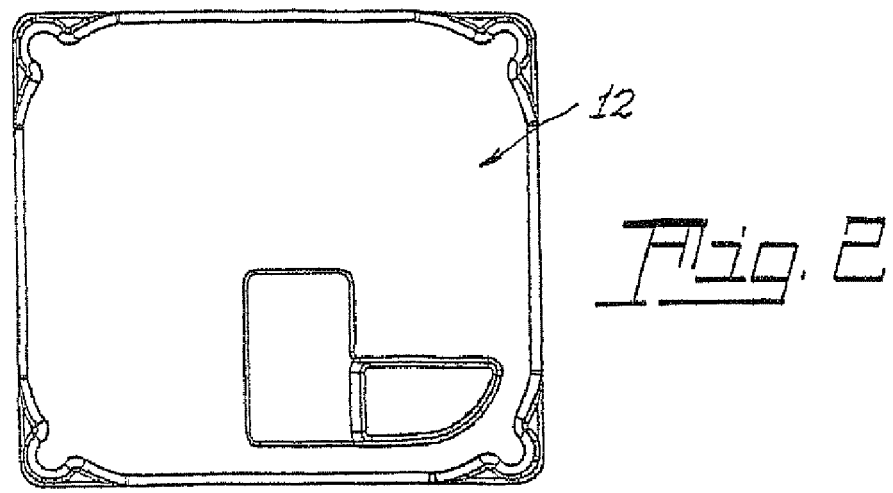
FIG. 2 is a plan view of a second half of a housing for an electronic assembly.
Figure 1:
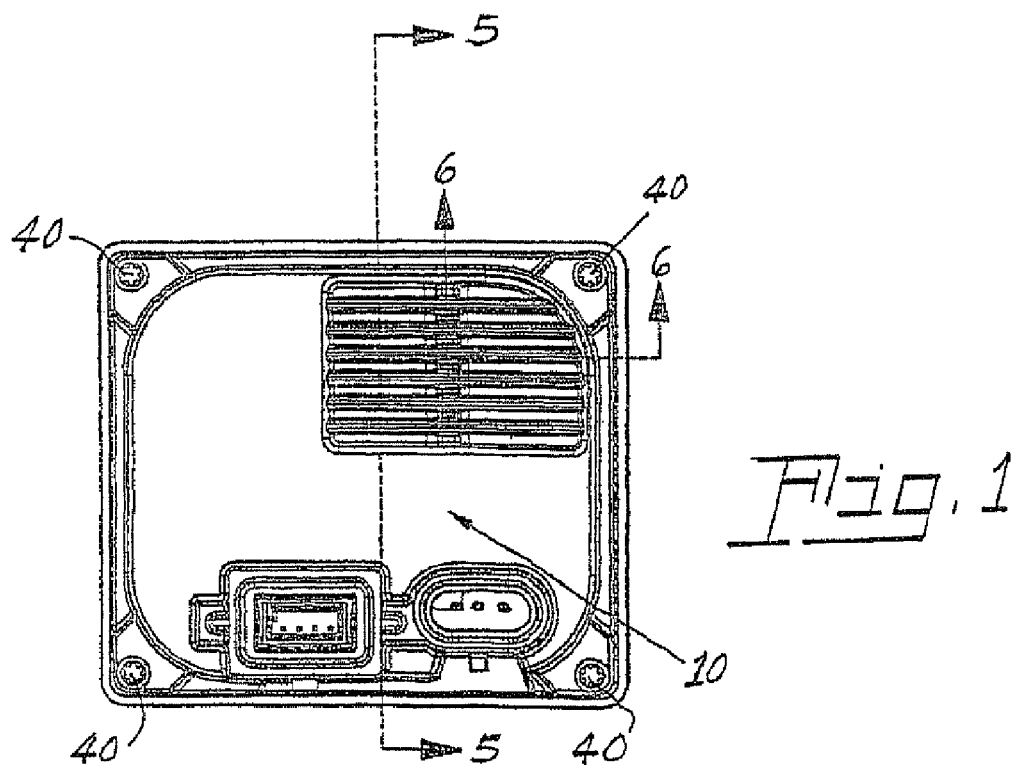
FIG. 1 is a plan view of a first half of a housing for an electronic assembly.
Figure 3:
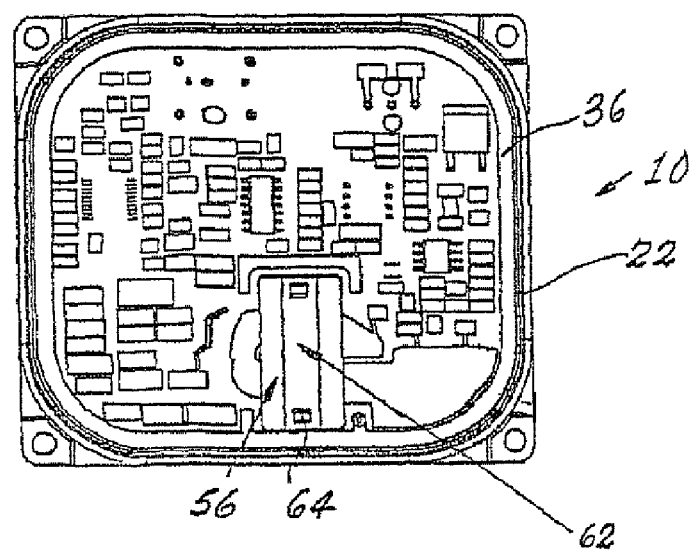
FIG. 3 is a plan view of the first half of the housing of FIG. 1 in an inverted position and having a printed circuit board installed.
Figure 4:
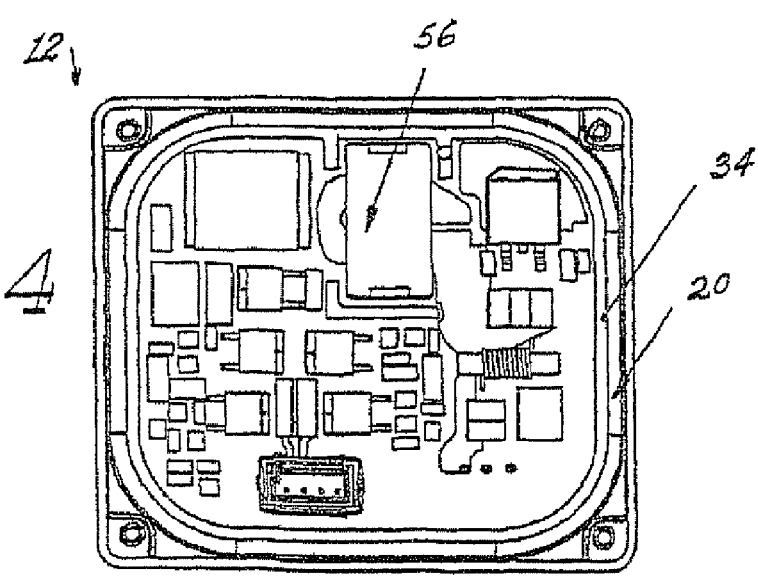
FIG. 4 is a similar view of the second half of the housing of FIG. 2.

Referring now to the drawings with greater particularity, there is shown in FIGS. 1 and 2 an electronic assembly that comprises a housing having a first half 10 and a second half 12. The first half 10 and the second half 12 are substantially quadrangular in configuration and each includes concave portions 14, 16, respectively. A peripheral groove 18 is formed in the second half 12 and has an O-ring 20 positioned therein.

A depending peripheral flange 22 is formed on the first half 10 for engaging the O-ring 20 when the halves are mated, as best seen in FIGS. 5 and 6.

At least one first upstanding wall 24 is formed in the first half 10 and at least one second upstanding wall 26 is formed in the second half 12, the walls being in opposition to one another and defining a space therebetween. In FIG. 5 two such walls 24 and 26 are shown.

A printed circuit board 28 is positioned between the walls 24 in the first half and the walls 26 in the second half. The printed circuit board has first and second surfaces 30, 32, with the usual compliment of electrically conductive traces formed thereon.

Additionally, a first peripheral electrical conductor 34 is formed on the first surface 30 and a second peripheral electrical conductor 36 is formed on the second surface 32. The peripheral electrical conductors are in contact with the first upstanding wall 24 and the second upstanding wall 26. At least one electrical conductor 38 (preferably more than one) extends through the printed circuit board 28 and is in electrical contact with the peripheral electrical conductors 34, 36 formed on the first and second surfaces 30, 32.

A plurality of retainers 40, which can be externally threaded bolts, pass through the first half and into the second half, applying pressure to the printed circuit board for maintaining the printed circuit board in its desired location, thereby eliminating the need for separate screws or other holding devices to hold the printed circuit board in position and greatly reducing mechanical stresses on the board and the components carried thereon. Electromagnetic interference is suppressed by virtue of the contact between the peripheral electrical conductors 34, 36 and the first and second halves 10, 12.

The printed circuit board 28 includes at least one heat-generating component 42, (see FIG. 6) and the heat-generating component 42 has thermal transferring media 44, 46 placed between the component 42 and the printed circuit board. The heat-generating component can be a power conditioning, semiconductor such as a MOSFET, for example and the thermal transferring media can be a deformable thermal putty.

The printed circuit board 28 additionally includes electrical components 48, 50 and these electrical components are isolated from the first and second housing halves by air gaps 52, 54, as shown in FIG. 5.

In addition to the electrical components designated above, it also is usual for the printed circuit board 28 to contain a ferrite component 56 which may comprises two halves 58, 60, the halves 58, 60 being joined together by a spring clip 62 that includes at least two leaf springs 64 in contact with a surface of one of said first housing half or said second housing half. In the embodiment shown in FIG. 5 the spring clips 64 engage a surface 66 in the second half 12.

Thus there is provided an electronic assembly having reduced mechanical stress in an included printed circuit board, good heat and electrical isolation where necessary and superior EMI suppression, the latter stemming from the portion of a Faraday cage created when the two perimeter conductors 34, 36 and the copper connector 38 that extends between them are contacted by the first half 10 and the second half 12.

While there have been shown and described what are present considered to be the preferred embodiments of the invention, it will be apparent to those skilled in the art that various changes and modifications can be made herein without departing from the scope of the invention as defined by the appended claims.

What is claimed is:

1. An electronic assembly comprising:
   a housing having a first housing portion (10) and a second housing portion (12), said first housing portion (10) and said second housing portion (12) being substantially quadrangular in configuration and each including concave portions (14, 16);
   a peripheral groove (18) formed in said second housing portion (12);
   an O-ring (20) positioned in said groove (18);
   a depending peripheral flange (22) formed on said first housing portion (10) for engaging said O-ring (20) when said portions are mated;
   at least one first upstanding wall (24) formed in said first housing portion (10) and at least one second upstanding wall (26) formed in said second housing portion (12), said walls being in opposition to one another and defining a space therebetween;
   a printed circuit board (28) positioned between said wall (24) in said first housing portion (10) and said wall (26) in said second housing portion (12), said printed circuit board (28) having first and second surfaces (30, 32);
   a first peripheral electrical conductor (34) formed on said first surface (30) and a second peripheral electrical conductor (36) formed on said second surface (32) and in contact with said first upstanding wall (24) and said second upstanding wall (26);
   at least one electrical conductor (38) extending through said printed circuit board (28) and in electrical contact with said peripheral electrical conductors (34, 36) formed on said first and second surfaces (30, 32); and
   a plurality of retainers (40) passing through said first half housing portion (10) and into said second housing portion (12),
   whereby pressure is applied to said printed circuit board (28) for maintaining said printed circuit board (28) in its desired location and electromagnetic interference is suppressed by virtue of the contact between said peripheral electrical conductors (34, 36) and said first and second halves housing portions (10, 12), wherein said first peripheral electrical conductor (34) and said second peripheral electrical conductor (36) extend substantially about the entire periphery of said printed circuit board (28).

2. The electronic assembly of claim 1 wherein said printed circuit board (28) includes at least one heat generating component (42), said heat generating component (42) having thermal transferring media (44, 46) placed between the component (42) and the printed circuit board (28).

3. The electronic assembly of claim 1 wherein said printed circuit board (28) includes electrical components (48, 50) and said electrical components are isolated from said first and second housing portions by air gaps (52, 54).

4. The electronic assembly of claim 1 wherein said printed circuit board (28) contains a ferrite component (56) comprising two ferrite portions (58, 60), said ferrite portions (58, 60) being joined together by a spring clip (62) that includes at least two leaf springs (64) in contact with a surface of one of said first housing portion (10) or said second housing portion (12).

* * * * *